United States Patent
Mallery et al.

(10) Patent No.: US 6,558,562 B2
(45) Date of Patent: May 6, 2003

(54) WORK PIECE WAND AND METHOD FOR PROCESSING WORK PIECES USING A WORK PIECE HANDLING WAND

(75) Inventors: Daniel S. Mallery, Aloha, OR (US); Doug Kreager, Lake Oswego, OR (US); Chris E. Barns, Portland, OR (US)

(73) Assignee: Speedfam-IPEC Corporation, Chandler, AZ (US)

( * ) Notice: Subject to any disclaimer, the term of this patent is extended or adjusted under 35 U.S.C. 154(b) by 82 days.

(21) Appl. No.: 09/948,836

(22) Filed: Sep. 7, 2001

(65) Prior Publication Data

US 2002/0067985 A1 Jun. 6, 2002

Related U.S. Application Data

(60) Provisional application No. 60/250,570, filed on Dec. 1, 2000.

(51) Int. Cl.[7] .............................. B44C 1/22; H01L 21/00
(52) U.S. Cl. .................. 216/38; 156/345.12; 216/88; 438/692; 438/745
(58) Field of Search .................. 156/345.12; 216/38, 216/88, 89, 91; 438/691, 692, 745

(56) References Cited

U.S. PATENT DOCUMENTS

| | | |
|---|---|---|
| 5,324,155 A | 6/1994 | Goodwin et al. |
| 5,329,732 A | 7/1994 | Karlsrud et al. |
| 5,431,421 A | 7/1995 | Thompson et al. |
| 5,445,172 A | 8/1995 | Thompson et al. |
| 5,486,131 A | 1/1996 | Cesna et al. |
| 5,498,199 A | 3/1996 | Karlsrud et al. |
| 5,547,515 A | 8/1996 | Kudo et al. |
| 5,555,064 A | 9/1996 | Breivogel et al. |
| 5,555,634 A | 9/1996 | Uchiyama et al. |
| 5,615,988 A | 4/1997 | Wiesler et al. |
| 5,643,061 A | 7/1997 | Jackson et al. |
| 5,643,366 A | 7/1997 | Somekh et al. |
| 5,746,460 A | 5/1998 | Marohl et al. |
| 5,765,889 A | 6/1998 | Nam et al. |
| 5,788,453 A | 8/1998 | Donde et al. |
| 5,838,121 A | 11/1998 | Fairbairn et al. |
| 5,851,140 A | 12/1998 | Barns et al. |
| 5,944,476 A | 8/1999 | Bacchi et al. |
| 5,955,858 A | 9/1999 | Kroeker et al. |
| 5,988,971 A | 11/1999 | Fossey et al. |
| 5,993,141 A | 11/1999 | Wytman |

*Primary Examiner*—William A. Powell
(74) *Attorney, Agent, or Firm*—Ingrassia Fisher & Lorenz, P.C.

(57) ABSTRACT

A wafer handling wand allows the efficient loading and unloading of semiconductor wafers to and from a CMP apparatus. The wand includes identical work piece gripping, alignment, and loading/unloading mechanisms on the top and bottom sides. A processed wafer can be unloaded from the apparatus onto one side of the wand and an unprocessed wafer can be loaded into the apparatus from the second side. The gripping mechanism includes a support area and a spaced apart moveable gripping finger. Wafer loading is facilitated by a cam attached to the support area that rotates when the cam contacts the apparatus. Upon rotation, the cam provides a surface for directing the work piece into the apparatus. The surface of the cam also includes an alignment aid that can be brought into contact with a reference surface on the apparatus to insure proper alignment between the wand and the apparatus.

38 Claims, 13 Drawing Sheets

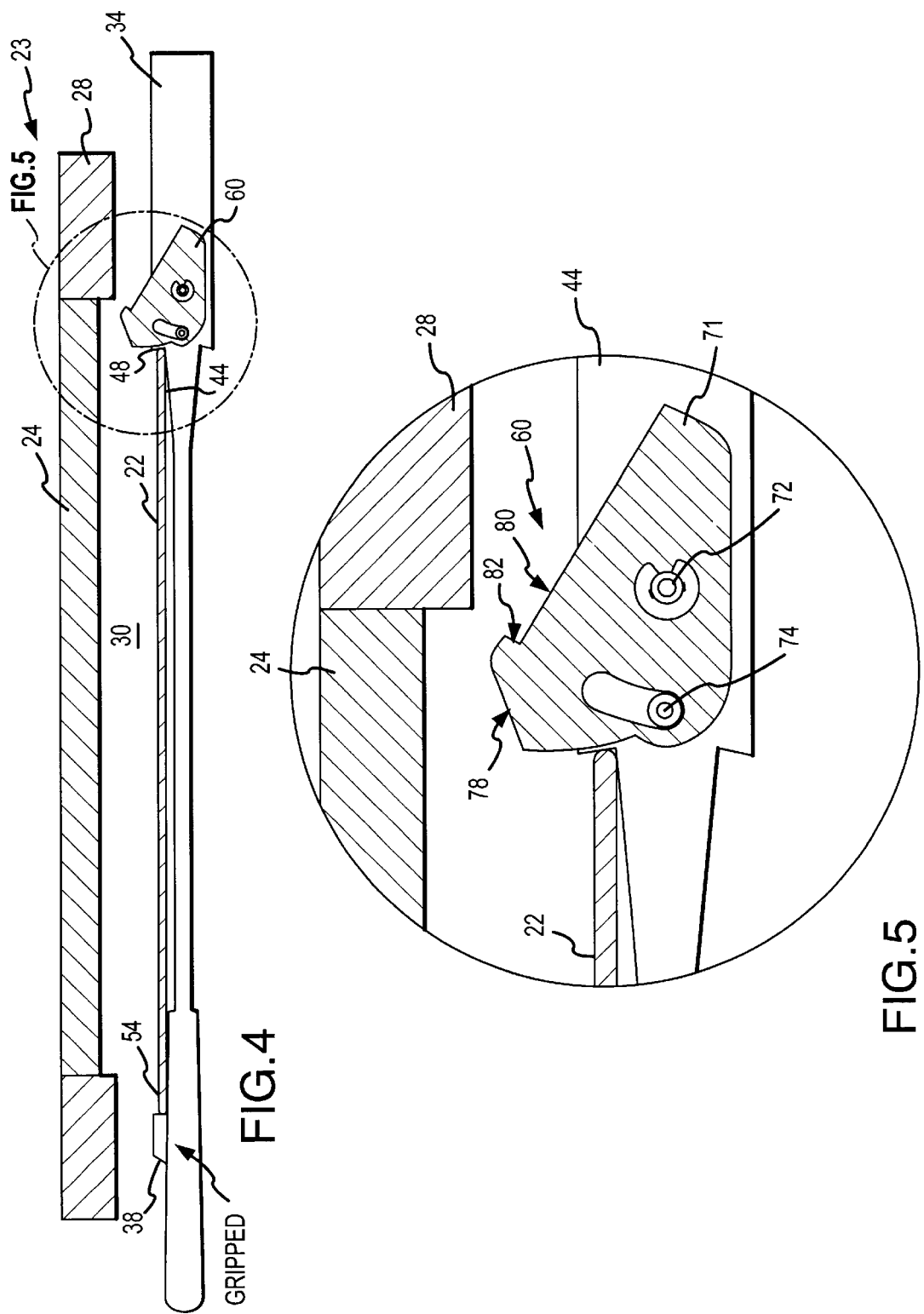

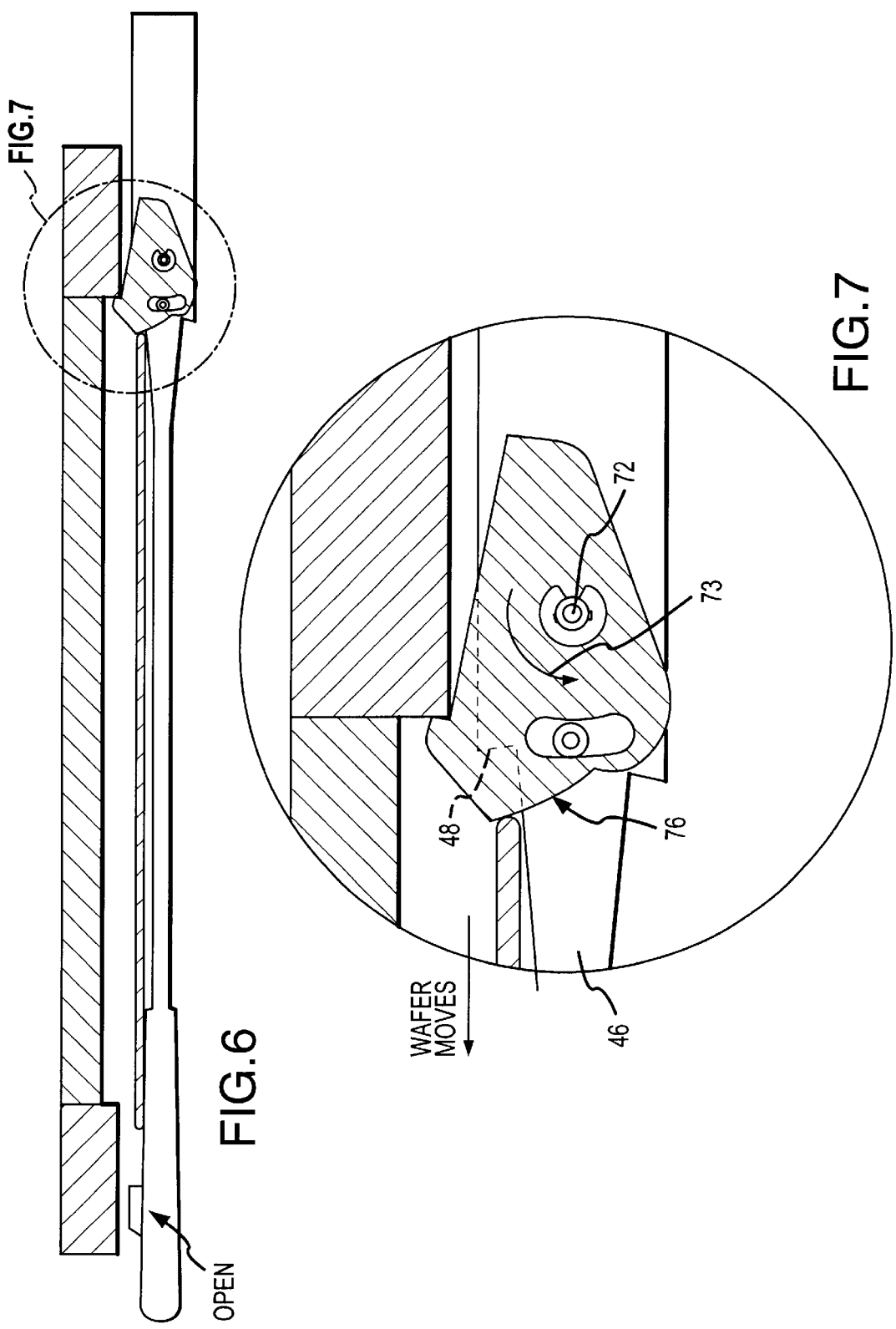

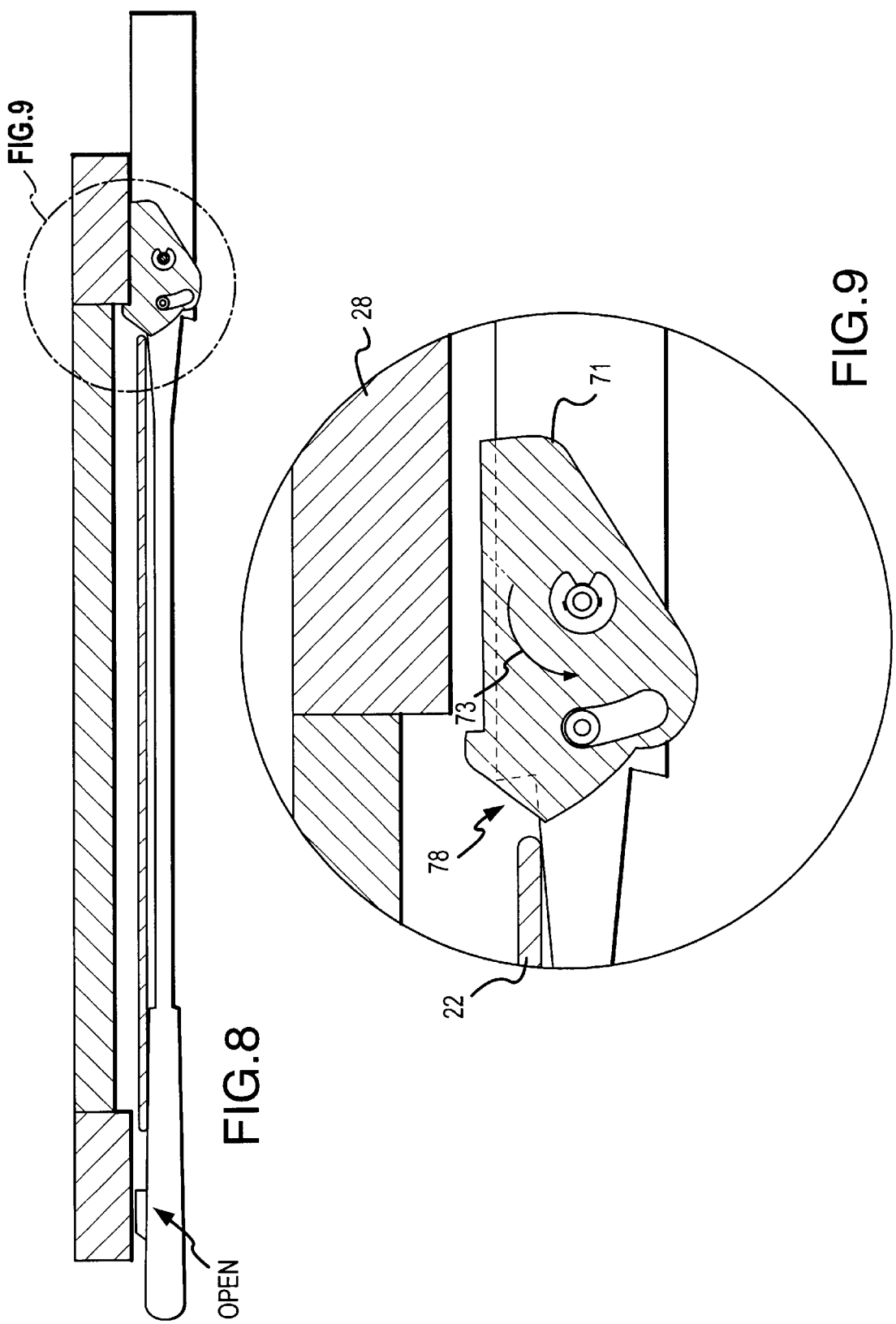

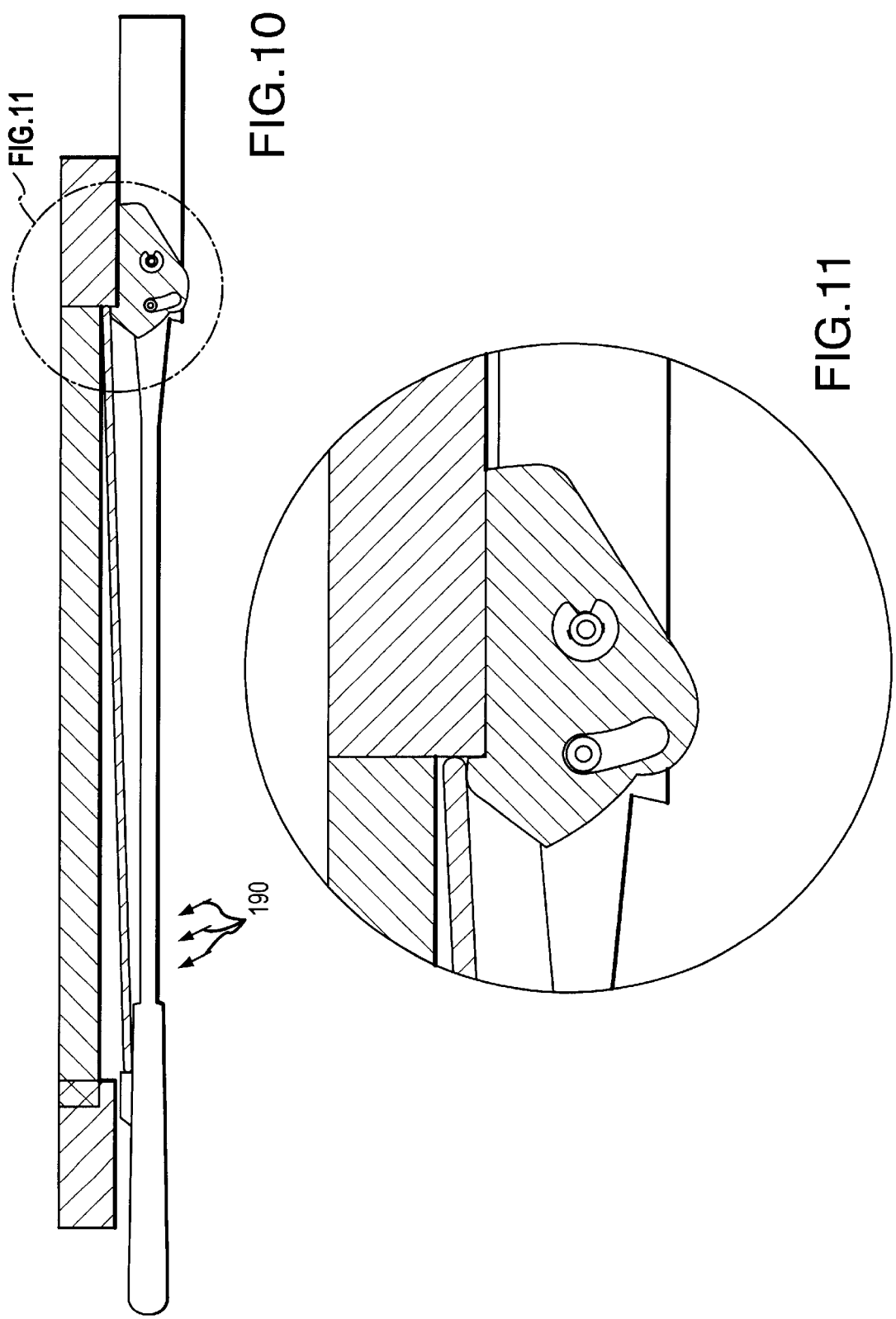

WORK PIECE WAND AND METHOD FOR PROCESSING WORK PIECES USING A WORK PIECE HANDLING WAND

CROSS REFERENCE TO RELATED APPLICATIONS

This application is related to and claims priority from Provisional Application Ser. No. 60/250,570 filed Dec. 1, 2000.

FIELD OF THE INVENTION

This invention relates generally to a wand for handling a work piece, and more specifically, in one embodiment, to a work piece handling wand for efficiently loading and unloading work pieces into and from a processing apparatus and to a method for processing work pieces that involves the use of such a wand.

BACKGROUND OF THE INVENTION

Many manufacturing processes require the automated loading and unloading of work pieces into and out of a processing apparatus. For example, work pieces may be moved sequentially from one piece of processing apparatus or from a work piece storage site such as a work piece cache into a second work piece processing apparatus. After being processed in the second work piece processing apparatus, each work piece may then be transferred to yet another piece of processing apparatus or to another work piece cache. In the interest of reducing cost and increasing productivity, such movement of work pieces is often accomplished with the aid of an end effector or work piece handling wand on the end of a robotic arm. The manner in which the work pieces are contacted by the wand and the accuracy of the placement of the work pieces is often of critical importance to the yield of the process.

An example of one such manufacturing process is the planarization of a surface of a work piece, a process that finds application in the manufacture of many types of products. Examples of work pieces that require a planar surface include semiconductor wafers, optical blanks, memory disks, and the like. Chemical mechanical planarization (CMP) is one accepted method of achieving a planar surface. The CMP method typically requires the work piece to be loaded into and mounted on a carrier head in a manner such that the surface that is to be planarized is exposed. The exposed side of the work piece is then held against a polishing pad and a relative motion is initiated between the work piece surface and the polishing pad. A polishing slurry, including an abrasive and at least one chemically-reactive agent, is introduced at the interface between the work piece surface and the pad.

Many types of work pieces such as the semiconductor wafers on which integrated circuits and other semiconductor devices are manufactured are typically processed in batches or lots that include a plurality of work pieces. For example, with the CMP processing of semiconductor wafers, each of the wafers in a lot must be sequentially loaded from a wafer cache onto the carrier head for planarization. Following the planarization, each wafer is unloaded from the carrier head and again placed in a wafer cache or is directly transferred to a subsequent processing apparatus such as a cleaning station. The loading and unloading operations are accomplished using a wafer handling wand.

With many work pieces, and certainly with semiconductor device wafers, the surfaces of the work pieces can be easily damaged if the handling wand contacts the surface. Because of this, the wand should preferably contact only the edge of the work piece or, or at most, the surface within a narrow distance from the edge.

Loading a work piece into a conventional carrier head for performing chemical mechanical planarization of that work piece presents problems for conventional work piece handling wands. The conventional carrier head includes a circular work piece carrier plate having a diameter substantially equal to the diameter of the work piece to be polished. An annular wear ring composed of a hard material such as ceramic is rigidly mounted to the main carrier head housing immediately radially outward of the rigid carrier plate. The wear ring has a diameter just slightly larger than the diameter of the work piece. To carry out the planarization operation, the work piece must be mounted against the carrier plate within the confines of the wear ring.

In the CMP process the carrier head with a work piece mounted thereon is pressed against a polishing pad so that the wear ring and the surface of the work piece are pressed against the pad. The pad then is set into motion to begin the polishing process. The work piece is maintained on center with respect to the carrier head by the cylindrical inside surface of the wear ring which traps the work piece between the polishing pad and the carrier plate. In order to maintain the precise control of the position of the work piece necessary for CMP, the clearance between the outside diameter of the work piece and the inside diameter of the wear ring must be kept to a minimum. For example, in the CMP processing of a 200 mm (8 inch) semiconductor wafer the clearance is typically less than 1 mm. This tight tolerance between the work piece and the wear ring poses substantial design challenges in terms of the necessity for highly accurate positioning of the work piece prior to loading the work piece in the carrier head. To accomplish a reliable loading of the carrier head, given the tight tolerance restrictions, the robotic arm must be able to pick up a work piece from the previous station and place it in the carrier head with a combined positional accuracy of less than 0.5 mm. A work piece that is out of position at the previous station when it is picked up by the robot arm and/or a robot tool point position that is out of position at the carrier head by more than a combined 0.5 mm will cause the work piece to be misloaded, leading to a stoppage in the throughput of the CMP apparatus. Worse, if a failure in the loading of the carrier head is not detected, the work piece can slip between the wear ring and polishing pad, resulting in a total loss of the work piece. In addition, because of the fragile nature of the surfaces of the work piece, it is desirable that the work piece be contacted only on its edges, and this complicates the task of inserting the work piece into the recess formed by the wear ring.

Many other types of processing apparatus also require that the work piece be aligned within tight tolerances during the loading operation. Although robotic handling equipment can generally perform repeated operations with great precision, some alignment aid is still necessary to account for manufacturing tolerances, wear, run out, and the like.

Accordingly, there exists a need for a work piece handling wand that can load work pieces into and unload work pieces from a work piece processing apparatus with a high degree of precision and without adversely contacting the critical surfaces of the work piece. There also exists a need for a method for processing work pieces in an efficient manner using such a work piece handling wand.

BRIEF DESCRIPTION OF THE DRAWINGS

FIGS. 4–11 illustrate, in cross section, positioning of a work piece and work piece handling wand relative to a work piece processing apparatus during the loading of the work piece into the apparatus;

DETAILED DESCRIPTION OF THE INVENTION

Figure 1:
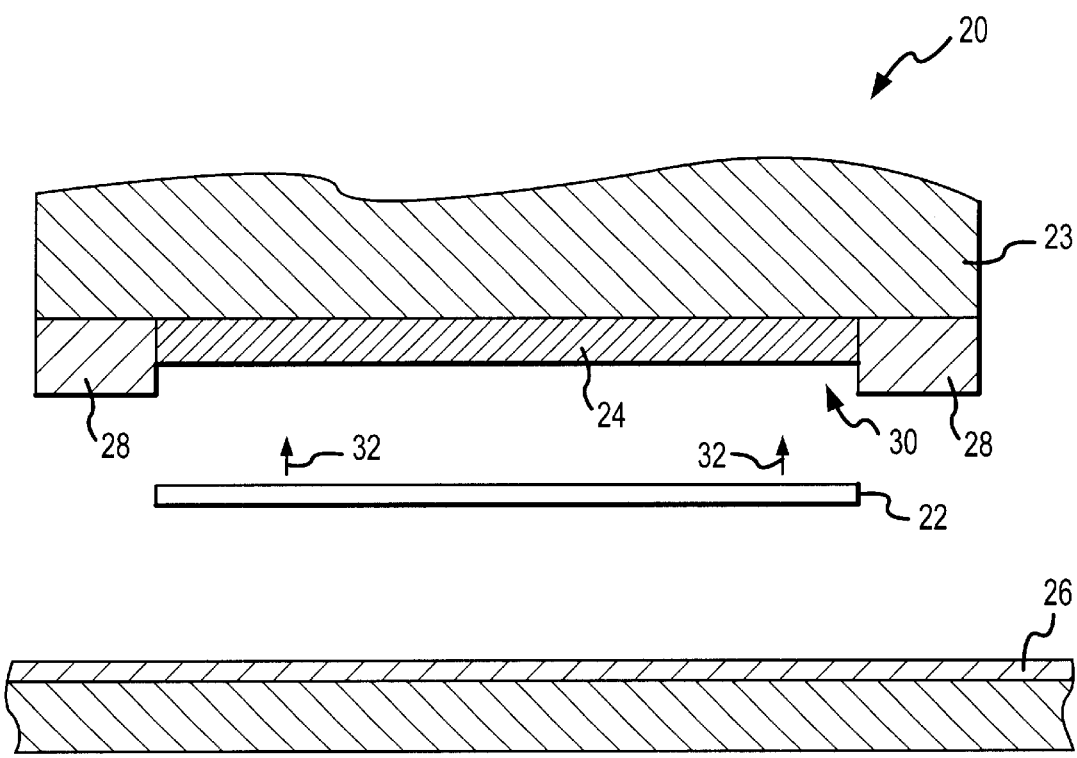
FIG. 1 illustrates schematically, in cross section, a portion of a CMP processing apparatus with which a work piece handling wand can be utilized.

In accordance with one embodiment of the invention, a work piece handling wand is provided that facilitates the accurate loading of an unprocessed work piece into a processing apparatus and the unloading of a processed work piece from that apparatus following a processing operation. In accordance with a further embodiment of the invention, a two sided work piece handling wand is provided that facilitates the loading and unloading operations. One embodiment of the invention further includes a method, using a work piece handling wand, for processing work pieces.

The drawing figures are intended to illustrate the general manner of construction of the inventive apparatus and are not necessarily to scale. In the description and in the claims, the terms such as up, down, upper, lower, top, bottom, and the like are used for descriptive purposes. However, it is understood that the embodiments of the invention described herein are capable of operation in other orientations than as shown, and the terms so used are only for the purpose of describing relative positions and are interchangeable under appropriate circumstances. For purposes of illustration only, the invention will be described as it applies to a CMP apparatus and to a CMP process and specifically as they apply to the CMP processing of a semiconductor wafer. It is not intended, however, that the invention be limited to these illustrative embodiments; instead, the invention is applicable to a variety of processing apparatus and to the processing and handling of many types of work pieces.

FIG. 1 illustrates schematically, in cross section, a portion of a CMP processing apparatus 20 with which a work piece handling wand in accordance with the invention is particularly useful. The apparatus is designed to produce a planar surface on a semiconductor wafer 22. The apparatus includes a wafer carrier 23 to which the wafer is mounted. The wafer carrier, in turn, includes a carrier plate or diaphragm 24 that presses against the upper surface of wafer 22. By pressing against the back or upper surface of the wafer, the front or lower surface, the surface to be planarized, is pressed against a polishing pad 26. A wear ring 28 surrounds wafer 22 and prevents the wafer from sliding out from under the carrier during the planarization operation. The wear ring and diaphragm thus form a recess 30 into which and from which the wafer must be transferred.

At the initiation of the planarization process wafer carrier 23 is raised in the vertical direction to a position out of contact with the polishing pad. Wafer 22, which may have been stored, for example, in a wafer cache or queue, is inserted into recess 30 as indicated by the arrows 32 where it is held, for example, by a vacuum exerted against diaphragm 24. The carrier is then lowered to place the wear ring and the lower surface of wafer 22 into contact with polishing pad 26. Relative motion between the polishing pad and the wafer carrier is initiated, and slurry is introduced at the interface between the wafer and the polishing pad to achieve the desired planarization. At the completion of the planarization operation, the wafer carrier is again raised out of contact with the polishing pad, vacuum exerted against wafer 22 is released, and the wafer is unloaded from recess 30. The wafer may be transferred from the wafer carrier to another wafer cache or, alternatively, directly to a subsequent processing apparatus.

Recess 30, into which wafer 22 is loaded, has a diameter only slightly greater than the diameter of the wafer and has a depth that is substantially the same as the thickness of the wafer. The wafer does not, therefore, protrude from the recess and little lateral tolerance exists for properly positioning the wafer within the recess. The wafer handling wand used to accomplish the loading and unloading operations must be able to accurately position the wafer within the recess without damaging the surfaces of the wafer or the wear ring. Preferably the wafer handling wand must be able to accomplish the loading and unloading operations by contacting only the edges of the wafer.

Figure 2:
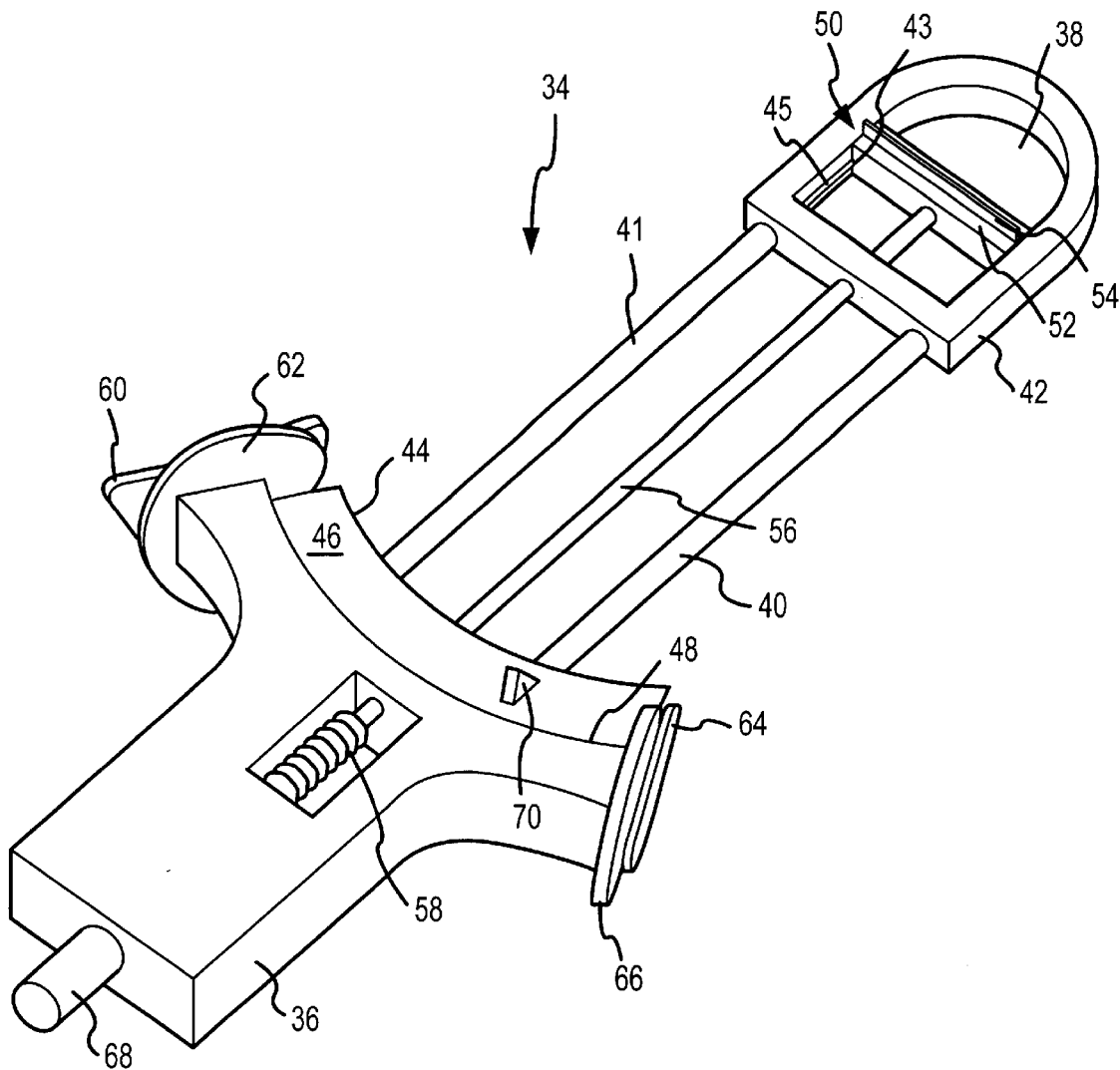
FIG. 2 illustrates, in perspective view, a work piece handling wand in accordance with one embodiment of the invention.

FIG. 2 illustrates, in perspective view, a work piece handling wand 34 in accordance with one embodiment of the invention. Wand 34 is designed to grip a work piece, a semiconductor wafer in this exemplary embodiment, on only one side of the wand. In accordance with a preferred embodiment of the invention, to be described in detail below, an alternative work piece handling wand is designed to grip two work pieces, one on each of the top and bottom sides of the wand. Wand 34 is described first because the structure and function of the wand are easier to visualize and understand with the single sided wand.

Work piece handling wand 34 includes a generally Y-shaped structure 36 and a moveable gripping finger 38 spaced apart from the Y-shaped structure. A pair of struts 40 and 41 extend from the Y-shaped structure to an arm assembly 42. Moveable gripping finger 38 is coupled to the arm assembly and is configured to have a groove 43 allowing sliding movement in tongues 45 in the arm assembly. The sliding movement allows the gripping finger to move from an extended position having a maximum separation between the Y-shaped structure and the gripping finger to a retracted position at which the gripping finger is closer to the Y-shaped structure.

Figure 3:
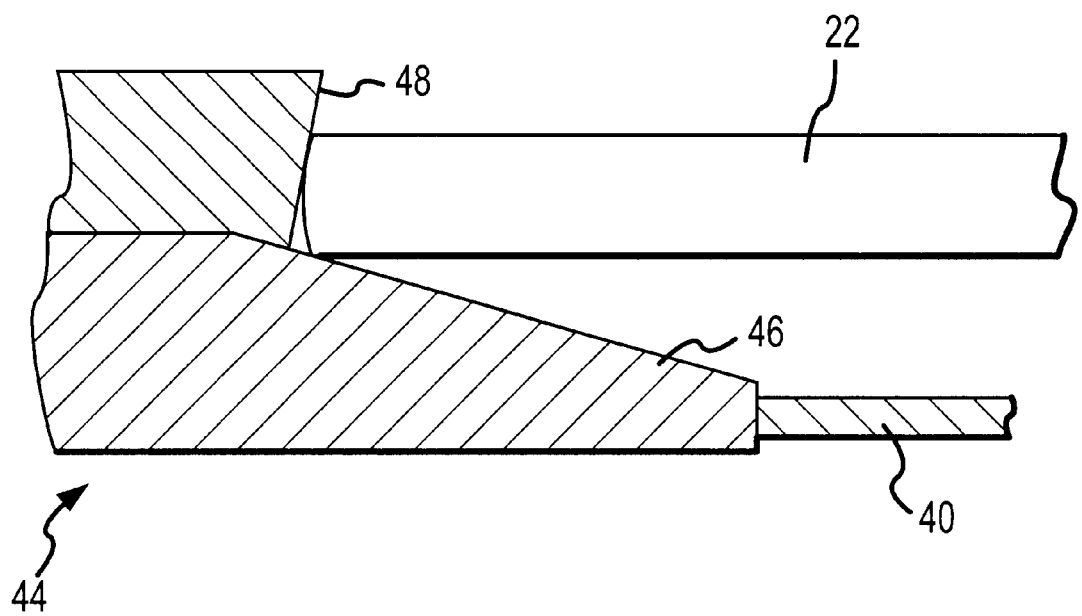
FIG. 3 illustrates, in cross section, a preferred relationship between a work piece handling wand and the edge of a work piece.

Y-shaped structure 36 includes a support area 44 that, in turn, includes a support shelf 46 and a raised wall 48 extending upwardly from the support shelf as also illustrated in FIG. 3. The support area has a generally concave arcuate shape having a diameter of curvature substantially the same as the diameter of the work piece that is to be handled by the wand. Preferably support shelf 46 is sloped downwardly with respect to a line extending from the Y-shaped structure to the spaced apart moveable gripping finger. Raised wall 48 also preferably is canted inwardly in a direction toward the moveable gripping finger, and the angle subtended by the support shelf and the raised wall is preferably greater than 90°. The preferred angular relationship between the support shelf and the raised wall allows a wafer being transported to be contacted only at the wafer edge as illustrated in FIG. 3. FIG. 3 illustrates, in cross section, the relationship between the support area and a wafer 22 being transported by the wafer handling wand. Contact between the wand and the wafer is made only at the edge of the wafer, with minimal contact between the wand and either major surface of the wafer. The wafer preferably does not contact either of support struts 40, 41.

In the same manner, and again with reference to FIG. 2, moveable gripping finger 38 includes a support area 50 having a support shelf 52 and a raised wall 54. The angular relationship between support shelf 52 and raised wall 54 are preferably the same in nature as the angular relationship described above with respect to the components of support area 44.

Y-shaped structure 36 can further include a piston (not illustrated), such as a pneumatically activated piston, that is coupled to a drive rod 56 that, in turn is coupled to moveable gripping finger 38. Actuation of the piston causes the drive rod to move the gripping finger between the extended and retracted positions. An accordion style flexible elastomeric boot 58 covers the piston and protects it from contamination.

In accordance with one embodiment of the invention, wafer handling wand 34 also includes a cam mechanism 60 attached at one extremity of support area 44. As will be explained below, cam mechanism 60 aids in the alignment and loading of a wafer from the wafer handling wand to a wafer processing apparatus. In accordance with a further embodiment of the invention, wafer handling wand 34 also includes a second cam mechanism 62 attached to the extremity of the support area to aid in the unloading of a wafer from the wafer processing apparatus to the wafer handling wand as is explained more fully below. In accordance with a preferred embodiment of the invention, a third cam mechanism 64 substantially identical to cam mechanism 60 and a fourth cam mechanism 66 substantially identical to cam mechanism 62 are attached to the opposite extremity of support area 44 to enhance the wafer loading and unloading operations.

Y-shaped structure 36 can also include a fitting 68 by which the wafer handling wand can be attached to a robot arm. By coupling wand 34 to a robot arm, the loading and unloading of wafer can be robotically accomplished and controlled.

In accordance with one embodiment of the invention wafer handling wand 34 can be positioned so that a wafer to be picked up and transported by the wand is positioned between raised wall 48 of support area 44 and raised wall 54 of moveable gripping finger 38 when the gripping finger is in the extended position. The piston coupled to drive rod 56 can then be activated to move gripping finger 38 toward the retracted position. With the gripping finger in the retracted position, a wafer such as wafer 22 is gripped between the gripping finger and the support area of the Y-shaped structure. Preferably the wafer is contacted only at its edge as illustrated in FIG. 3. In accordance with one embodiment of the invention the Y-shaped structure can include a position sensor (not illustrated) that senses the position of the drive rod and hence the position of the moveable gripping finger. The sensor detects the position of the gripping finger to insure that the gripping finger has moved to a position such that the wafer can be properly confined between the gripping finger and the support area. In a preferred embodiment, the Y-shaped structure also includes a gravity activated position sensor 70 located on or as part of support shelf 46. Sensor 70 is hinged about an axis to have one end extend above the surface of support shelf 46 in the default position. When a wafer is correctly placed in the support area, the wafer presses down upon the upwardly extending end of the sensor causing the sensor to rotate about its axis and to send a signal to a sensor controller (not illustrated) indicating the presence of the wafer. The two sensors, the positional sensor coupled to the drive rod and gravity sensor 70, can be logically ANDed together to indicate the correct positioning and gripping of the wafer. If either sensor fails to send the correct signal to the sensor controller, the controller can provide an indication to the operator that the wafer is not properly positioned on the wand.

FIGS. 4–16 illustrate steps, in accordance with an embodiment of the invention, in the process of loading a wafer into a processing apparatus for processing and then unloading a processed wafer from the apparatus after processing using a work piece handling wand also in accordance with an embodiment of the invention. The positioning necessary for the initial alignment can be achieved by the robotic control. This initial positioning is illustrated in FIG. 4 which illustrates, in cross section. a portion of wafer carrier 23 of CMP processing apparatus 20 including diaphragm 24 and wear ring 28, wafer handling wand 34, and semiconductor wafer 22. Gripping finger 38 of the wafer handling wand is shown in the retracted position so that wafer 22 is gripped between raised wall 54 of the gripping finger and raised wall 48 of support area 44. The preferred initial position of the wand is a few millimeters offset (to the left in the figure) from the inner edge of the wear ring. This figure also illustrates one embodiment of cam mechanism 60 positioned at the extremity of support area 44. The cam mechanism and its relationship to wafer 22 are also seen in more detail in FIG. 5. To avoid complicating the drawings, cam mechanism 62, which plays no role in the loading of wafer 22 into recess 30 of the CMP apparatus, is not illustrated in FIGS. 4–11. Cam mechanism 60 includes a spring loaded cam 71 that is pivotally mounted to rotate about a pivot pin 72 when wand 34 is moved toward the wafer carrier and the cam contacts the under side of wear ring 28. The cam mechanism also includes a mechanical stop 74 that limits the rotation of the cam.

After the wafer handling wand is initially positioned in close proximity to recess 30 as illustrated in FIGS. 4 and 5, the piston controlling drive rod 56 is activated to cause moveable gripping finger 38 to move slightly in the direction of the extended gripping finger position. As illustrated in FIG. 6, this motion of the gripping finger releases wafer 22 from its tight contact with support area 44. Wand 34 is then moved upwardly toward recess 30, causing cam 71 to contact the lower surface of wear ring 28 as illustrated in FIG. 7. The contact with wear ring 28 causes cam 71 to begin to rotate in the direction indicated by arrow 73 about pivot pin 72 and against its loading spring. As the cam rotates, curved surface 76 contacts the edge of wafer 22 and moves the edge in the direction of arrow 77 away from and clear of raised wall 48 of support area 46. The movement away from the raised wall is possible because of the previous motion of the gripping finger toward the extended position. The position of wafer 22 after it is moved away from the raised wall is illustrated in FIGS. 6 and 7. The raised wall and a portion of the support shelf, hidden by cam 71, are indicated in dashed lines in this figure.

Cam 71 also includes a flat surface 78. As the wand is raised further toward wafer carrier 23, the contact between wear ring 28 and cam 71 causes the continued rotation of the cam in the direction of arrow 73. As the cam continues to rotate, the edge of wafer 22 is exposed to flat surface 78. Cam 71 also includes a second flat surface area 80, separated from flat surface 78 by an alignment aid 82. As cam 71 continues to rotate in response to further contact between the cam and the under side of wear ring 28, second flat surface area 80 becomes aligned parallel to the under side of the wear ring. Concurrent with this parallel alignment, the robotic assembly moves wand 34 (to the right in the figure) until alignment aid 82 contacts the inner diameter of the wear ring which functions as a reference surface on the wafer carrier. Bringing alignment aid 82 into contact with the inner diameter of the wear ring insures that wafer handling wand 34 and wafer 22 are properly aligned with the recess in wafer carrier 23. The alignment of the wafer handling wand and the positioning of the wafer edge in proper relationship to flat surface 78 are illustrated in FIGS. 8 and 9.

When cam 71 has rotated to position flat surface 78 in alignment with the edge of wafer 22, the piston controlling drive rod 56 and gripping finger 38 is again activated to cause the gripping finger to again move toward the retracted position. The gripping finger thus again presses against the far edge of the wafer and causes the near edge of the wafer to slide up onto flat surface 78. This action raises the near edge of water 22 as the flat surface acts as a ramp to load the near edge of the wafer toward the inner radius of the wear ring. The result of this motion is illustrated in FIGS. 10 and 11.

Preferably the length of alignment aid 82 in the direction between flat surface 78 and flat surface 80, in other words the spacing between the two flat surfaces, is selected based on the depth of recess 30 and the thickness of semiconductor wafer 22. In accordance with this preference, the length of the alignment aid is selected to be approximately equal to the depth of the recess minus the thickness of the semiconductor wafer.

Following the alignment of the wafer handling wand to recess 30 in wafer carrier 23, and the insertion of the edge of wafer 22 into the recess, the wafer can be drawn fully into the recess by a vacuum applied to diaphragm 24. Additionally, perforations may be provided in diaphragm 24 to facilitate the application of a vacuum to the upper surface of wafer 22. In accordance with a further embodiment of the invention, a jet of air, water, or other fluid may be applied to the lower surface of wafer 22, as illustrated schematically by arrows 90 in FIG. 10, to direct the wafer into the recess. With the wafer properly positioned in recess 30, the wafer handling wand can be withdrawn and the processing apparatus can be used to process the wafer. In the illustrative embodiment, CMP apparatus 20 can be used to planarize the lower surface of wafer 22 by lowering the wafer carrier to place the lower wafer surface into contact with a polishing pad.

FIGS. 12–16 illustrate process steps, in accordance with an embodiment of the invention by which a processed work piece can be unloaded from the processing apparatus. In accordance with that embodiment, cam mechanism 62 functions to aid in the proper unloading of the wafer from the wafer carrier and onto the wafer handling wand following the completion of the CMP or other processing operation. Cam mechanism 62 includes a second spring loaded cam 84 that is configured to rotate about a pivot point in response to its cam surface contacting the wear ring. Cam mechanism 62 also includes a mechanical stop that limits the rotation of the cam. In accordance with one embodiment of the invention, pivot pin 72 of cam mechanism 60 can serve as the mechanical stop for cam mechanism 62, and mechanical stop 74 of cam mechanism 60 can serve as the pivot pin for cam mechanism 62. Cam 84 is mounted at the extremity of support area 44 next to and behind cam 71 (as viewed in FIGS. 12–16). Although cam 84 is behind and partially hidden by cam 71, for purposes of illustration, the rotational position of cam 84 is fully shown in each of the figures.

Figure 12:
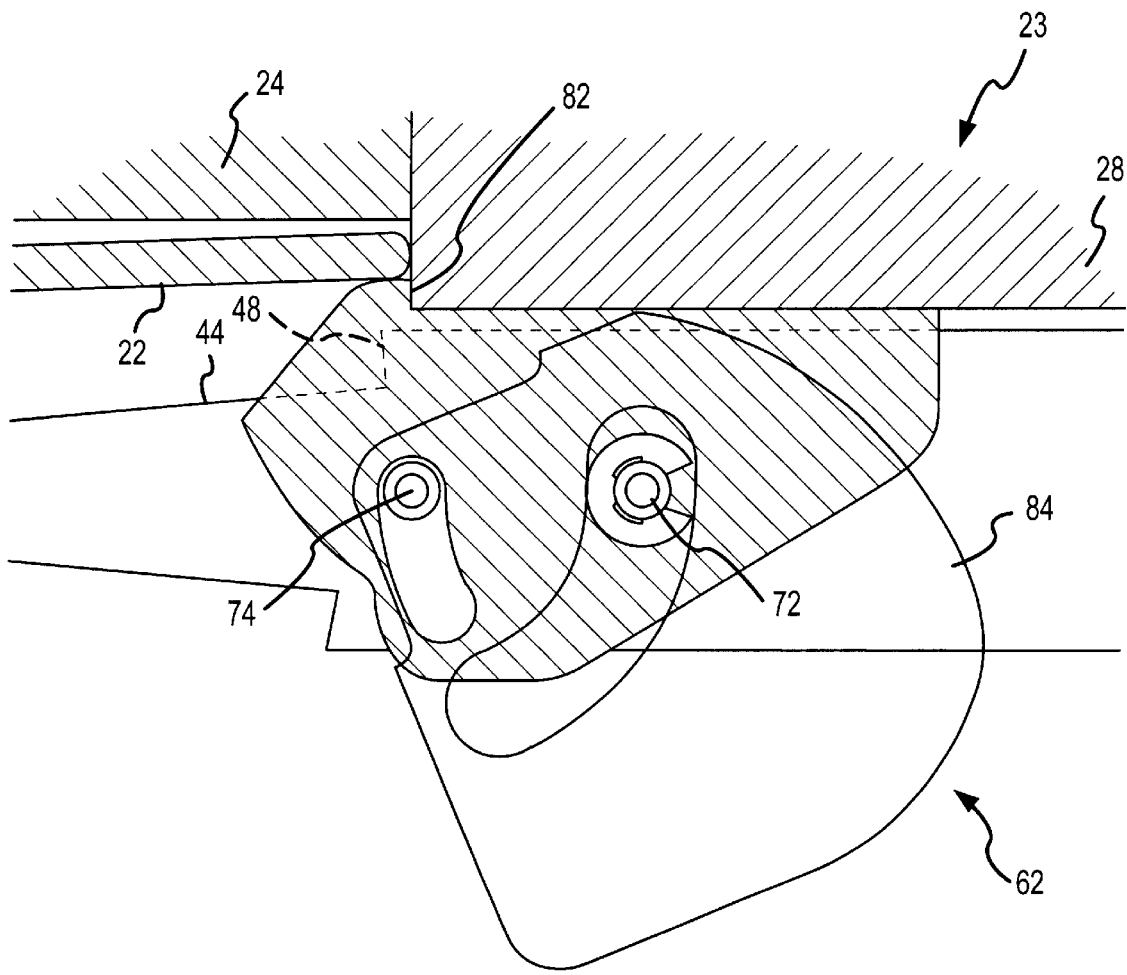
FIGS. 12–16 illustrate, in cross section, positioning of a work piece and work piece handling wand relative to a work piece processing apparatus during the unloading of the work piece from the apparatus.

Cam 84 plays no role in the loading operation previously described. After the completion of the processing operation performed on wafer 22 such as the process of planarizing the lower surface of the wafer, the wafer carrier is raised above the polishing pad. A wafer handling wand 34 is inserted into the space between the wafer carrier and the polishing pad and is aligned with the wear ring of the wafer carrier in the same manner as described above with respect to the wafer loading operation as illustrated in FIG. 12. That is, alignment aid 82 is brought into contact with the inner surface of wear ring 28.

Figure 13:
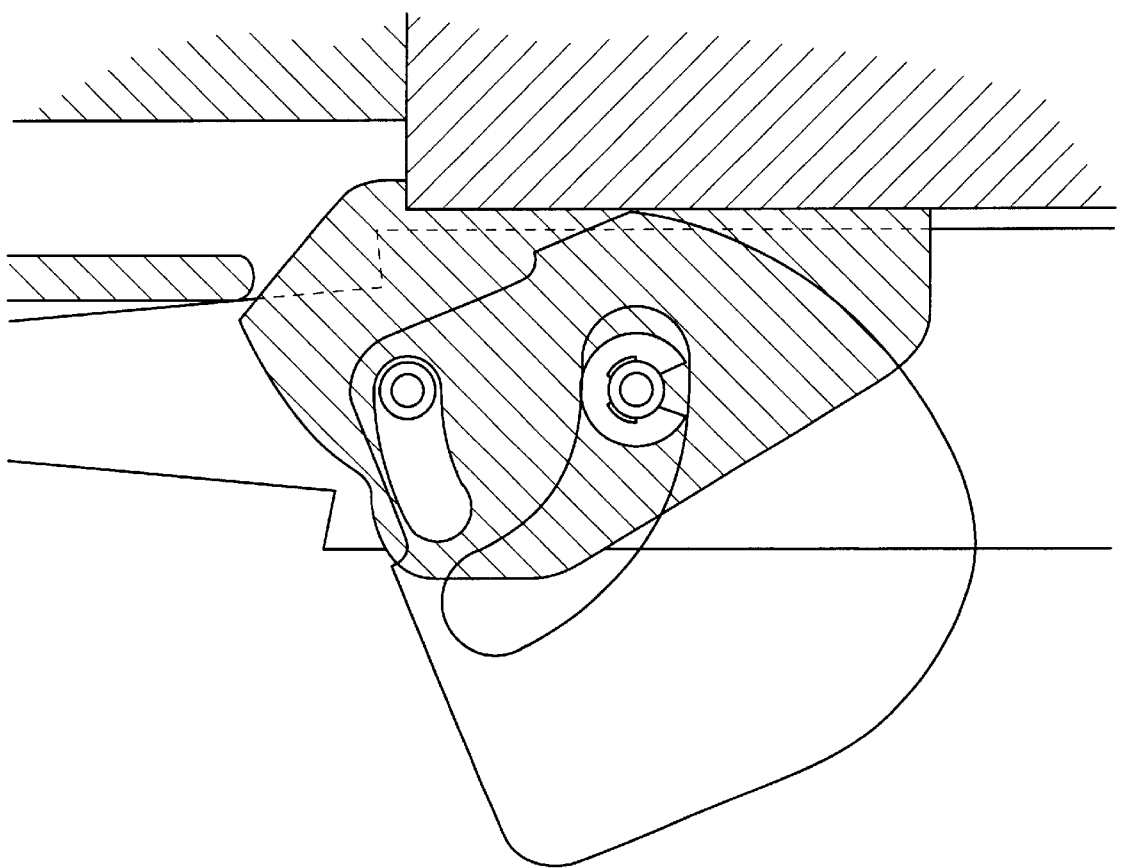
Figure 14:
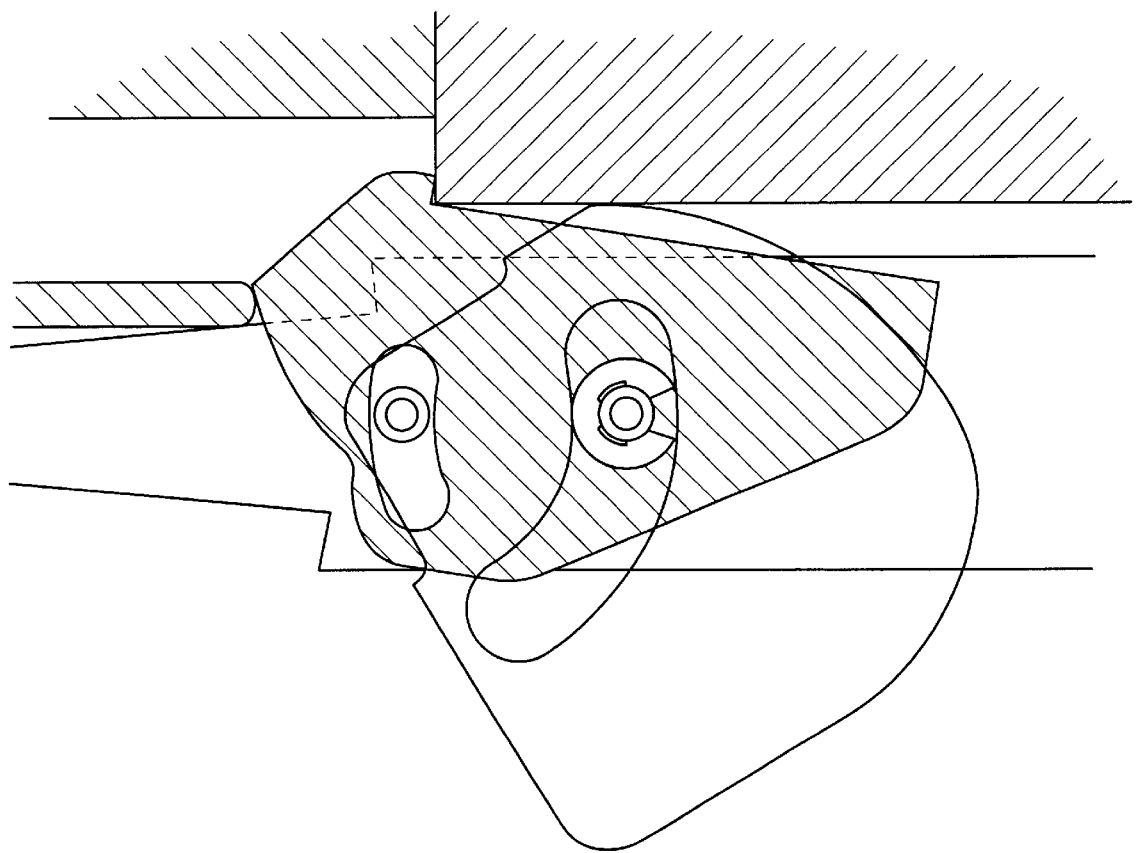
Figure 15:
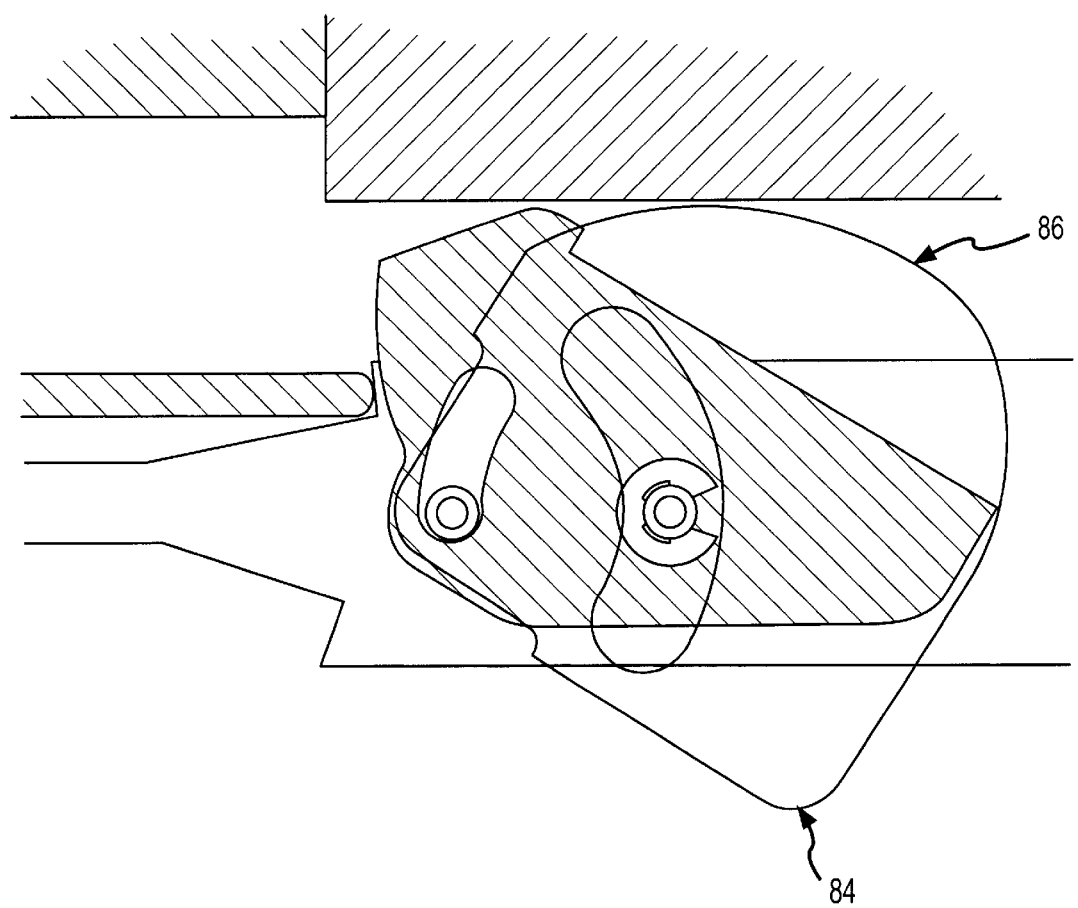
Figure 16:
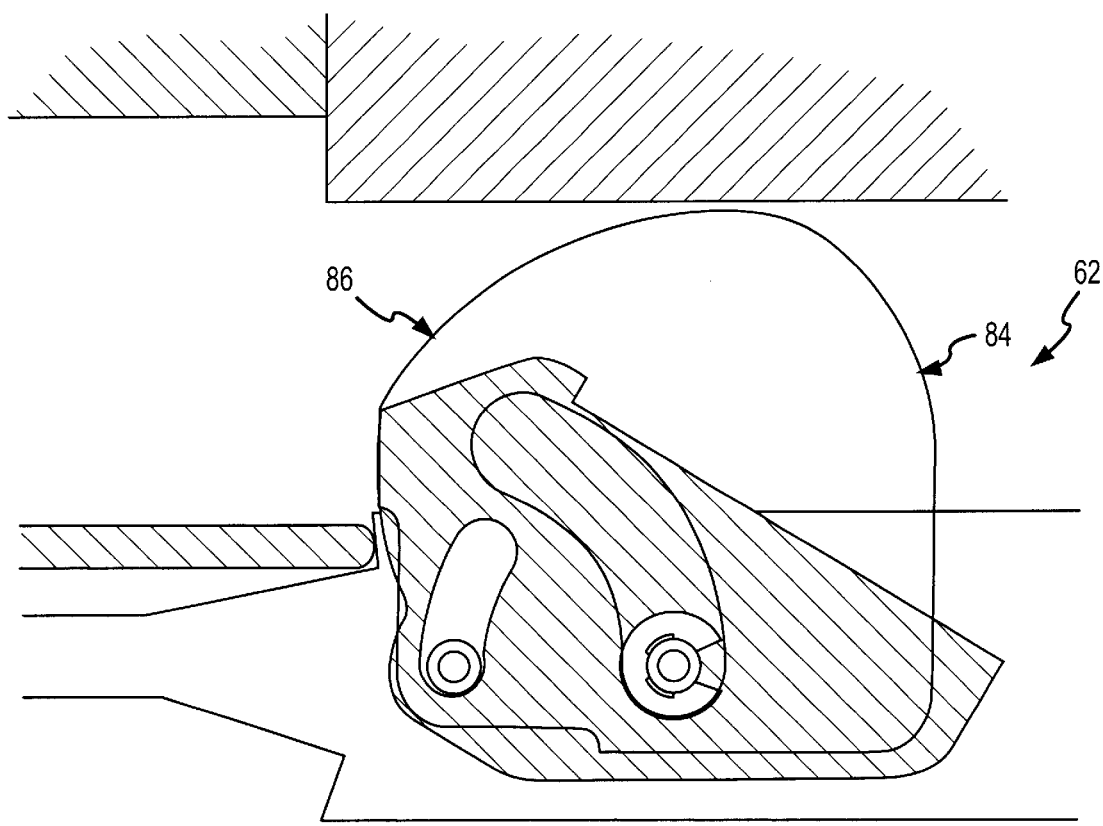

Moveable gripping finger 38 (not illustrated in this figure) is placed in the extended position. The vacuum holding wafer 22 to the flexible diaphragm 24 of wafer carrier 23 is released so that the wafer can drop into the space on the wand between raised wall 48 on support area 44 and raised wall 54 (not illustrated in this figure) on moveable gripping finger 38 as illustrated in FIG. 13. In FIGS. 12 and 13 cam 71 is seen to be fully rotated in the counter clockwise direction and up against stop 74 and cam 84 is seen to be fully rotated in the clockwise direction and up against stop 72. As the wand is robotically moved vertically downward away from the wear ring, cam 71 rotates in the clockwise direction and cam 84 rotates in the counter clockwise direction as seen in FIGS. 14 and 15. In FIG. 15 cam 71 is seen to be fully rotated in the clockwise direction and up against stop 74. As the wand continues to move downward, cam 84 continues to rotate to the position illustrated in FIG. 16. The curved surface 86 on the edge of cam 84 provides a guiding ramp, as illustrated in FIG. 16, that guides wafer 22 into the proper position on the wafer handling wand and act to prevent the wafer from coming to rest on and hanging up on cam 71. After the wafer is positioned on the wafer handling wand, the piston controlling drive shaft 56 and moveable gripping finger 38 is activated to cause the gripping finger to move to the retracted position to grasp the wafer edge securely between the support area and the gripping finger. Once secured to the wafer handling wand, the processed wafer can be robotically transported to another wafer cache or to a subsequent processing apparatus.

Figure 17:
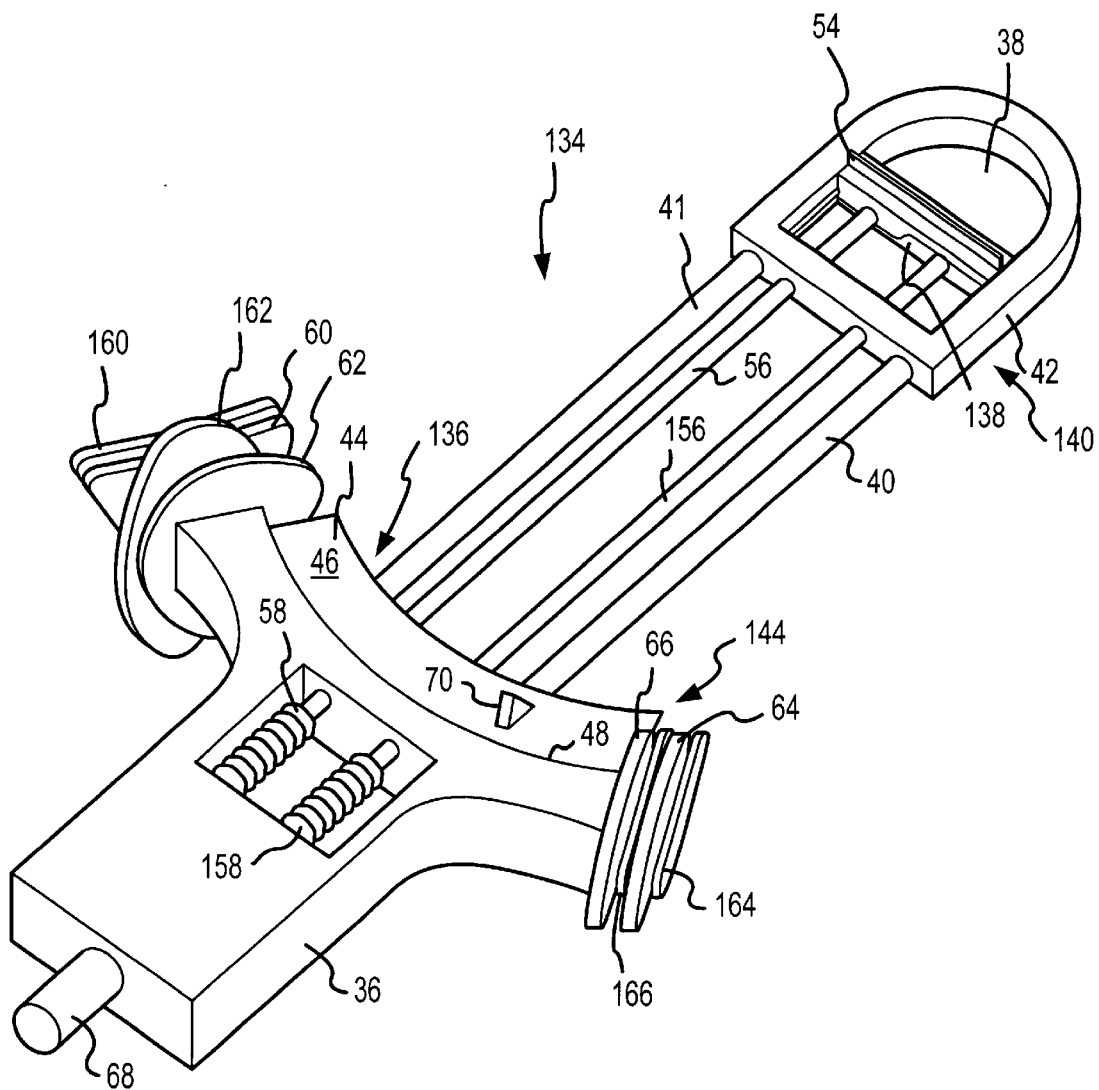
FIG. 17 illustrates, in perspective view, a work piece handling wand in accordance with a further embodiment of the invention.

FIG. 17 illustrates, in perspective view, a work piece handling wand 134 in accordance with a more preferred embodiment of the invention. Wand 134 is useful in an efficient process of unloading a processed work piece from a processing apparatus and subsequently loading an unprocessed work piece into that apparatus. Wand 134 is similar to wand 34 described above except that it is two sided. That is, the first side 136, or top side as viewed in the figure, of wand 134 is substantially similar to wand 34. Accordingly, the same numerals have been used to identify like components. The first side of wand 134 includes a support area 44 that is part of a Y-shaped structure 36. Spaced apart from the Y-shaped structure and supported on support struts 40 and 41 is an arm assembly 42 that carries a moveable gripping finger 38. Sliding movement of the gripping finger is controlled by a piston (not shown) that drives a drive rod 56. An elastomeric boot 58 covers the piston and protects it from contamination. The support area and gripping finger are configured to grip a work piece for transport to or from a work piece cache and to and from a work piece processing apparatus. Cam mechanism 60 and preferably also cam mechanism 62 are located at one extremity of the Y-shaped structure to aid, respectively, in the loading of work pieces into a work piece processing apparatus from the first side and the unloading of work pieces from a work piece processing apparatus onto the first side. Preferably, similar cam mechanisms 64 and 66 are located at the opposite extremity of the Y-shaped structure. The second side 140, or underside as viewed in the figure, of wand 134, in accordance with one embodiment of the invention, is also similar to wand 34 and to the first side of wand 136. The second side of wand 134 includes a support area 144 that is part of Y-shaped structure 36. Arm assembly 42 also carries a moveable gripping finger 138 on its second side that faces support area 144. Sliding movement of gripping finger 138 is controlled by a piston (not shown) that drives a drive rod 156. An elastomeric boot 158 covers the piston and protects it from contamination. As with the first side, the support area and gripping finger on the second side are configured to grip a work piece for transport to and from a work piece cache and to and from a work piece processing apparatus. Cam mechanism 160 and preferably also cam mechanism 162 are located at one extremity of the Y-shaped structure to aid, respectively, in the loading of work pieces from the second side into a work piece processing apparatus and the unloading of work pieces from a work piece processing apparatus into the second side. Preferably, similar cam mechanisms 164 and 166 are located at the opposite extremity of the Y-shaped structure. The above described components of the underside of work piece handling wand 134 function in the same manner as do their counterpart components of wand 34. Preferably cam mechanisms 60, 64, 160, and 164 include identical cams. Similarly, in a preferred embodiment, cam mechanisms 62, 66, 162, and 166 also include identical cams. The form and function of the components of work piece handling wand 134 are the same as the form and function of their counterpart components of work piece handling wand 34 and, therefore, will not be described again in detail.

In accordance with one embodiment of the invention, work piece handling wand 134 can be used in an efficient manner for the loading and unloading of work pieces. A first unprocessed work piece can be loaded into a work piece processing apparatus, such as a CMP apparatus, by work piece handling wand 134 in the same manner as described above for the use and operation of work piece handling wand 34. While that first work piece is being processed by the work piece processing apparatus, a second unprocessed work piece can be retrieved from a work piece cache by the first side of wand 134. At the completion of the processing of the first work piece, that first work piece, now processed, can be unloaded from the work piece processing apparatus onto the second side of work piece handling wand 134. The unloading operation can be accomplished in the same manner as described above for the unloading of a work piece (wafer) onto work piece handling wand 34. Wand 134 can then be rotated by 180° about an axis extending from Y-shaped structure 36 to the arm assembly 42 in order to position the second work piece below the work piece processing apparatus. The second work piece can then be loaded into the processing apparatus in the same manner as described above. While the second work piece is being processed by the work piece processing apparatus, the work piece handling wand can transport the processed first work piece to a work piece cache or to a subsequent processing apparatus and can retrieve a third unprocessed work piece from the work piece cache. The process can then be repeated.

In accordance with one embodiment of the invention, the above described two sided work piece handling wands have similar first and second sides and the first and second sides have similar functions. In accordance with a further embodiment of the invention (not illustrated), the two sides of the work piece handling wand can be different, with one side optimized for the loading of work pieces into a work piece processing apparatus and a second side optimized for the unloading of work pieces from a piece of work piece processing apparatus. For example, instead of having cam mechanisms, such as cam mechanisms 60 and 62, on both sides of the wand, a cam mechanism optimized for loading could be positioned on only one side of the wand and a cam mechanism optimized for unloading could be positioned only on the opposite side of the wand.

Thus it is apparent that there has been provided, in accordance with the invention, a work piece handling wand and a method for processing work pieces using such a wand that fully meets the needs set forth above. Although the invention has been described with reference to certain illustrative embodiments thereof, it is not intended that the invention be limited to these embodiments. Those of skill in the art will recognize that may variations and modifications exist that do not depart from the true spirit of the invention. For example, other means can be utilized to sense the correct positioning of a work piece on the work piece handling wand. Likewise, other means exist for supporting the arm assembly in spaced apart relationship to the Y-shaped structure and for moving the gripping finger relative to the support area. Indeed, even the so called Y-shaped structure may itself take on other shapes or forms. For purposes of illustration only, the invention has been described with reference to a work piece handling wand that has been optimized for handling a semiconductor wafer and specifically for handling a semiconductor wafer in a CMP process. The invention is not to be limited to its application to semiconductor wafers or to a CMP process. Rather the invention is applicable to a broad range of work pieces and to a broad range of processes performed on such work pieces. Accordingly, it is intended to include within the invention all such variations and modifications as fall within the scope of the appended claims.

What is claimed is:

1. A work piece handling wand for loading an unprocessed work piece into a work piece processing apparatus and for unloading a processed work piece from the work piece processing apparatus, the work piece handling wand comprising:

a support area comprising a support shelf and a raised wall extending upwardly from the support shelf, the support shelf and raised wall configured to contact an edge of a work piece at a first location;

a gripping finger spaced apart from the support area, the gripping finger moveable from an extended position to a retracted position and configured to engage the edge of the work piece at a second location on a side of the work piece opposite the first location and to move the edge at the first location into contact with the support area when the gripping finger is moved to the retracted position; and a cam mechanism coupled to the support area and configured to raise the edge at the first location out of contact with the support area in response to the work piece handling wand being brought into proximity with the work piece processing apparatus.

2. The work piece handling wand of claim 1 wherein the raised wall comprises a concave arcuate shape having a diameter substantially equal to a diameter of the work piece.

3. The work piece handling wand of claim 2 wherein the support shelf is inclined below a line extending from the support area to the gripping finger and the raised wall is canted inwardly toward the gripping finger.

4. The work piece handling wand of claim 1 wherein the gripping finger comprises:
   a finger support shelf; and
   a finger raised wall extending upwardly from the finger support shelf.

5. The work piece handling wand of claim 4 wherein the finger support shelf is inclined below a line extending from the support area to the gripping finger and the finger raised wall is canted inwardly toward the support area.

6. The work piece handling wand of claim 1 further comprising an arm assembly spaced apart from and coupled to the support area by a support strut extending from the support area to the arm assembly, the gripping finger slideably moveable on the arm assembly.

7. The work piece handling wand of claim 6 further comprising a drive rod extending from the support area to the gripping finger and capable of moving the gripping finger on the arm assembly between the extended position and the retracted position.

8. The work piece handling wand of claim 1 wherein the cam mechanism comprises a spring loaded cam mounted at an extremity of the support area and configured to be rotatable about a pivot pin in response to the cam contacting the work piece processing apparatus.

9. The work piece handling wand of claim 8 wherein the cam comprises a first curved surface configured to contact, upon rotation of the cam, the edge of the work piece and to move the edge out of contact with the raised wall.

10. The work piece handling wand of claim 9 wherein the cam further comprises a first substantially flat surface configured to provide, upon further rotation of the cam, a ramp upon which the work piece can be caused to slide to effect a raising of the work piece away from the support shelf.

11. The work piece handling wand of claim 10 wherein the cam further comprises a second substantially flat surface configured to seat, upon further rotation of the cam, against a flat surface on the work piece processing apparatus.

12. The work piece handling wand of claim 11 wherein the cam further comprises an alignment aid positioned between the first substantially flat surface and the second substantially flat surface, the alignment aid configured to mate with a reference surface on the work piece processing apparatus.

13. The work piece handling wand of claim 12 further comprising a second spring loaded cam coupled to the support area, rotatable about a second pivot pin in response to the second spring loaded cam contacting the work piece processing apparatus, and configured to provide a cam surface upon which a processed work piece can slide during an unloading operation.

14. The work piece handling wand of claim 13 wherein the pivot pin is configured to provide a stop limiting the rotation of the second spring loaded cam and the second pivot pin is configured to provide a stop limiting the rotation of the spring loaded cam.

15. The work piece handling wand of claim 13 further comprising a third spring loaded cam and a fourth spring loaded cam, each of the third spring loaded cam and the fourth spring loaded cam mounted at an opposite extremity of the support area, the third spring loaded cam substantially identical to the spring loaded cam and the fourth spring loaded cam substantially identical to the second spring loaded cam.

16. The work piece handling wand of claim 8 further comprising a second spring loaded cam coupled to the support area, rotatable about a second pivot pin in response to the second spring loaded cam contacting the work piece processing apparatus, and configured to provide a cam surface upon which a processed work piece can slide during an unloading operation.

17. The work piece handling wand of claim 16 wherein the support area and gripping finger are positioned on a first side of the work piece handling wand and the spring loaded cam and the second spring loaded cam are configured to operate in connection with a first work piece engaged by the support area and gripping finger, the work piece handling wand further comprising a second side opposite the first side, the second side of the work piece handling wand comprising:
   a second support area comprising a second support shelf and a second raised wall extending outwardly from the second support shelf, the second support shelf and the second raised wall configured to contact an edge of a second work piece at a first location;
   a second gripping finger spaced apart from the second support area, the second gripping finger moveable from an extended position to a retracted position and configured to engage the edge of the second work piece at a second location on a side of the second work piece opposite the first location and to move the edge of the second work piece at the first location into contact with the second support area when the second gripping finger is moved to the retracted position;
   a third spring loaded cam mounted at an extremity of the second support area, rotatable about the pivot pin, and having a surface configured to move the edge of the second work piece at the first location out of contact with the second raised wall in response to the third spring loaded cam contacting the work piece processing apparatus; and
   a fourth spring loaded cam coupled to the second support area, rotatable about the second pivot pin in response to the fourth spring loaded cam contacting the work piece processing apparatus, and configured to provide a cam surface upon which a processed work piece can slide during an unloading operation.

18. The work piece handling wand of claim 17 wherein the spring loaded cam and the third spring loaded cam are substantially identical in configuration and the second spring loaded cam and the fourth spring loaded cam are substantially identical in configuration.

19. The work piece handling wand of claim 1 wherein the support area and gripping finger are located on a first side of the work piece handling wand and the cam mechanism is configured to operate in connection with a first work piece engaged by the support area and gripping finger, the work piece handling wand further comprising a second side opposite the first side, the second side of the work piece handling wand comprising:
   a second support area comprising a second support shelf and a second raised wall extending outwardly from the second support shelf, the second support shelf and the second raised wall configured to contact an edge of a second work piece at a first location on the second work piece; and
   a second gripping finger spaced apart from the second support area, the second gripping finger moveable from an extended position to a retracted position and configured to engage the edge of the second work piece at a second location on a side of the second work piece opposite the first location on the second work piece and to move the edge at the first location on the second work piece into contact with the second support area when the second gripping finger is moved to the retracted position.

20. The work piece handling wand of claim 19 further comprising a second cam mechanism coupled to the second support area and configured to move the edge of the second work piece at the first location on the second work piece out of contact with the second raised wall in response to the work piece handling wand being brought into proximity with the work piece processing apparatus.

21. The work piece handling wand of claim 20 further comprising a spring loaded cam coupled to the second support area, rotatable about a pivot pin in response to the spring loaded cam contacting the work piece processing apparatus, and configured to provide a cam surface upon which a processed work piece can slide during an unloading operation.

22. The work piece handling wand of claim 21 further comprising first and second position sensors configured to detect movement of the gripping finger and second gripping finger, respectively, to their respective retracted positions.

23. The work piece handling wand of claim 22 further comprising:
a first gravity sensor configured to detect the presence of the work piece seated against the support shelf; and
a second gravity sensor configured to detect the presence of the second work piece seated against the second support shelf.

24. The work piece handling wand of claim 23 wherein the first position sensor and the first gravity sensor are logically coupled in an AND configuration and wherein the second position sensor and the second gravity sensor are logically coupled in an AND configuration.

25. A work piece handling wand for loading an unprocessed work piece into a work piece processing apparatus and for unloading a processed work piece from the work piece processing apparatus, the work piece handling wand comprising:
a first side comprising a first support structure and a first movable gripping finger spaced apart from the first support structure and configured to confine a first work piece between the first support structure and the first movable gripping finger; and
a second side opposite the first side, the second side comprising a second support structure and a second movable gripping finger spaced apart from the second support structure and configured to confine a second work piece between the second support structure and the second movable gripping finger.

26. The work piece handling wand of claim 25 further comprising a first cam mechanism coupled to the first support structure and configured to raise an edge of an unprocessed work piece out of contact with the first support structure and toward a work piece processing apparatus in response to the work piece handling wand being brought into proximity with the work piece processing apparatus.

27. The work piece handling wand of claim 26 further comprising a second cam mechanism coupled to the second support structure and configured to guide a processed work piece from the work piece processing apparatus to a position where the processed work piece can be contacted by the second support structure and the second movable gripping finger.

28. The work piece handling wand of claim 27 further comprising:
a third cam mechanism substantially similar to the first cam mechanism, the third cam mechanism coupled to the second support structure; and a fourth cam mechanism substantially similar to the second cam mechanism, the fourth cam mechanism coupled to the first support structure.

29. A method for processing work pieces in a work piece processing apparatus, the method comprising the steps of:
gripping a first work piece by a first gripping mechanism on a first side of a work piece handling wand;
transferring the first work piece from the work piece handling wand to a work piece processing apparatus;
performing a process on the first work piece in the work piece processing apparatus;
gripping a second work piece by the gripping mechanism on the first side of the work piece handling wand;
transferring the first work piece from the work piece processing apparatus to a second gripping mechanism on a second side of the work piece handling wand;
rotating the work piece handling wand by 180°; and
transferring the second work piece from the work piece handling wand to the work piece processing apparatus.

30. The method of claim 29 wherein the step of performing a process comprises the step of performing a chemical mechanical planarization process.

31. The method of claim 29 wherein the step of gripping a first work piece comprises the steps of:
extending a first moveable gripping finger on the first side of the work piece handling wand to an extended position spaced apart from a first support area;
positioning the work piece handling wand to place the first work piece between the first moveable gripping finger and the first support area;
moving the first moveable gripping finger to a retracted position to move the first work piece into contact with the first support area and to confine the first work piece between the first moveable gripping finger and the first support area.

32. The method of claim 31 wherein the step of transferring the first work piece from the work piece handling wand comprises the steps of:
positioning the work piece handling wand and the first work piece below a work piece processing area of the work piece processing apparatus;
extending the first moveable gripping finger slightly in the direction of the extended position;
pressing a cam coupled to the support area against the work piece processing apparatus to cause the cam to rotate about a pivot pin;
causing a surface of the cam to contact an edge of the first work piece and to raise the first work piece out of contact with the first support area as the cam rotates;
moving the first moveable gripping finger toward the first support area to cause the edge of the first work piece to slide on the cam surface toward the work piece processing area.

33. The method of claim 32 further comprising the step of engaging an alignment aid on the surface of the cam with a reference surface on the work piece processing apparatus to align the first work piece with the work piece processing area.

34. The method of claim 29 wherein the step of transferring the first work piece from the work piece handling wand further comprises the step of applying a jet of fluid to a lower surface of the work piece to move the work piece into contact with the work piece processing apparatus.

35. The method of claim 29 wherein the step of transferring the first work piece from the work piece processing apparatus comprises the steps of:

aligning the second side of the work piece handling wand below a work piece processing area of the work piece processing apparatus;

moving a second moveable gripping finger on the second side of the work piece handling wand to an extended position spaced apart from a second support area on the second side of the work piece handling wand;

moving a second cam coupled to the second support area into contact with the work piece processing apparatus to cause the second cam to rotate about a pivot pin and to present a second cam surface to the first work piece;

allowing the first work piece to slide on the second cam surface to a position between the second gripping finger and the second support area; and moving the second moveable gripping finger to a retracted position to move the first work piece into contact with the second support area and to confine the first work piece between the second support area and the second moveable gripping finger.

36. A method for processing work pieces in a work piece processing apparatus, the method comprising the steps of:

transferring a first processed work piece from a work piece processing apparatus to a first side of a work piece handling wand;

rotating the work piece handling wand by 180°; and subsequently transferring a second unprocessed work piece from a second side of the work piece handling wand to the work piece processing apparatus.

37. A method for processing work pieces in a work piece processing apparatus, the method comprising the steps of:

positioning a work piece handling wand relative to a cache containing a plurality of work pieces;

gripping a first work piece from the plurality of work pieces by an edge grip mechanism on a first side of the work piece handling wand;

positioning the work piece handling wand below a work piece area of a work piece processing apparatus;

transferring the first work piece from the first side of the work piece handling wand to the work piece area;

processing the first work piece in the work piece processing apparatus;

gripping a second work piece from the plurality of work pieces by an edge grip mechanism on the first side of the work piece handling wand;

positioning the work piece handling wand below the work piece area of the work piece processing apparatus;

transferring the first work piece from the work piece processing apparatus to a second edge grip mechanism on a second side of the work piece handling wand;

rotating the work piece handling wand by 180° to position the second work piece below the work piece area of the work piece processing apparatus; and transferring the second work piece from the second side of the work piece handling wand to the work piece area.

38. The method of claim 37 wherein the step of processing the first work piece comprises the step of chemical mechanical planarizing a surface of the first work piece.

* * * * *